United States Patent
Lu et al.

(10) Patent No.: US 8,922,956 B2
(45) Date of Patent: Dec. 30, 2014

(54) TUNNELING MAGNETO-RESISTIVE SENSORS WITH BUFFER LAYERS

(75) Inventors: Bin Lu, San Ramon, CA (US); Qing He, Plymouth, MN (US); Mark Covington, Edina, MN (US); Yunhao Xu, Fremont, CA (US); Wei Tian, Eden Prairie, MN (US)

(73) Assignee: Seagate Technology LLC, Minneapolis, MN (US)

( * ) Notice: Subject to any disclaimer, the term of this patent is extended or adjusted under 35 U.S.C. 154(b) by 671 days.

(21) Appl. No.: 13/152,860

(22) Filed: Jun. 3, 2011

(65) Prior Publication Data

US 2011/0298456 A1 Dec. 8, 2011

Related U.S. Application Data

(60) Provisional application No. 61/351,788, filed on Jun. 4, 2010.

(51) Int. Cl.
G11B 5/39 (2006.01)
G01R 33/09 (2006.01)

(52) U.S. Cl.
CPC .................................. *G01R 33/098* (2013.01)
USPC ...................................................... 360/324.2

(58) Field of Classification Search
USPC .............................................. 360/324–324.2
See application file for complete search history.

(56) References Cited

U.S. PATENT DOCUMENTS

| | | | | |
|---|---|---|---|---|
| 5,952,097 A | * | 9/1999 | Zhang | 428/332 |
| 6,710,987 B2 | * | 3/2004 | Sun et al. | 360/324.2 |
| 7,595,520 B2 | * | 9/2009 | Horng et al. | 257/295 |
| 7,851,014 B2 | | 12/2010 | Nolan | |
| 7,986,498 B2 | * | 7/2011 | Wang et al. | 360/324.2 |
| 7,999,360 B2 | * | 8/2011 | Hong et al. | 257/659 |
| 8,537,504 B2 | * | 9/2013 | Lin | 360/324.11 |
| 2002/0163765 A1 | * | 11/2002 | Gill | 360/324.11 |
| 2008/0044688 A1 | * | 2/2008 | Li et al. | 428/831 |
| 2009/0108383 A1 | * | 4/2009 | Horng et al. | 257/421 |
| 2011/0007429 A1 | | 1/2011 | Dimitrov et al. | |
| 2013/0154038 A1 | * | 6/2013 | Horng et al. | 257/421 |
| 2013/0293225 A1 | * | 11/2013 | Singleton et al. | 324/252 |

* cited by examiner

*Primary Examiner* — Will J Klimowicz
(74) *Attorney, Agent, or Firm* — Mueting, Raasch & Gebhardt, P.A.

(57) ABSTRACT

In certain embodiments, a tunneling magneto-resistive (TMR) sensor includes a sensor stack positioned between a seed layer and a cap layer. The seed layer includes a first buffer layer that includes a non-magnetic nickel alloy.

In certain embodiments, a sensor stack includes a top and bottom shield and a seed layer positioned adjacent to the bottom shield. The seed layer has a first buffer layer that includes a nickel alloy.

7 Claims, 3 Drawing Sheets

TUNNELING MAGNETO-RESISTIVE SENSORS WITH BUFFER LAYERS

RELATED APPLICATIONS

This application claims the benefit of U.S. Provisional Application No. 61/351,788 filed Jun. 4, 2010, the content of which is hereby incorporated by reference in its entirety.

SUMMARY

Certain embodiments of the present invention are generally directed to devices that include a tunneling magneto-resistive (TMR) sensor having multiple buffer layers.

In certain embodiments, a tunneling magneto-resistive (TMR) sensor includes a sensor stack positioned between a seed layer and a cap layer. The seed layer includes a first buffer layer that includes a nickel alloy.

DETAILED DESCRIPTION

The present disclosure relates to buffer layers and shields for use in tunneling magneto-resistive (TMR) sensors.

Data storage devices, such as hard disk drives, can be provisioned with a magnetic recording head and a rotatable medium to which data are stored. As track density increases, the size of read sensors in magnetic heads is reduced because the bit size of the media being read is reduced. For example, at 1 Tb/in$^2$ and a bit aspect ratio of 4, the bit size in the media is about 12.5 nm by 50 nm.

When the media is being read (i.e. a playback process), a read sensor's signal-to-noise-ratio (SNR) and resolution can contribute to playback errors. To improve the read sensor's resolution, the read sensor's shield-to-shield-spacing (SSS) can be reduced. Further, controlling certain read sensor material characteristics, like orientation and roughness, can also be used to improve read sensor performance and overall SNR. Moreover, for TMR sensors having anti-ferromagnetic (AFM) layers, improvements can be achieved by varying AFM layer's ordering and magnetic dispersion as well as its indirect impact on subsequent layers, such as insulating tunnel barriers.

Certain embodiments of the present disclosure are accordingly directed to devices and methods for providing a tunneling-magneto resistive (TMR) sensor with controlled grain orientation and reduced shield-to-shield spacing, material roughness, and grain size.

Figure 1:
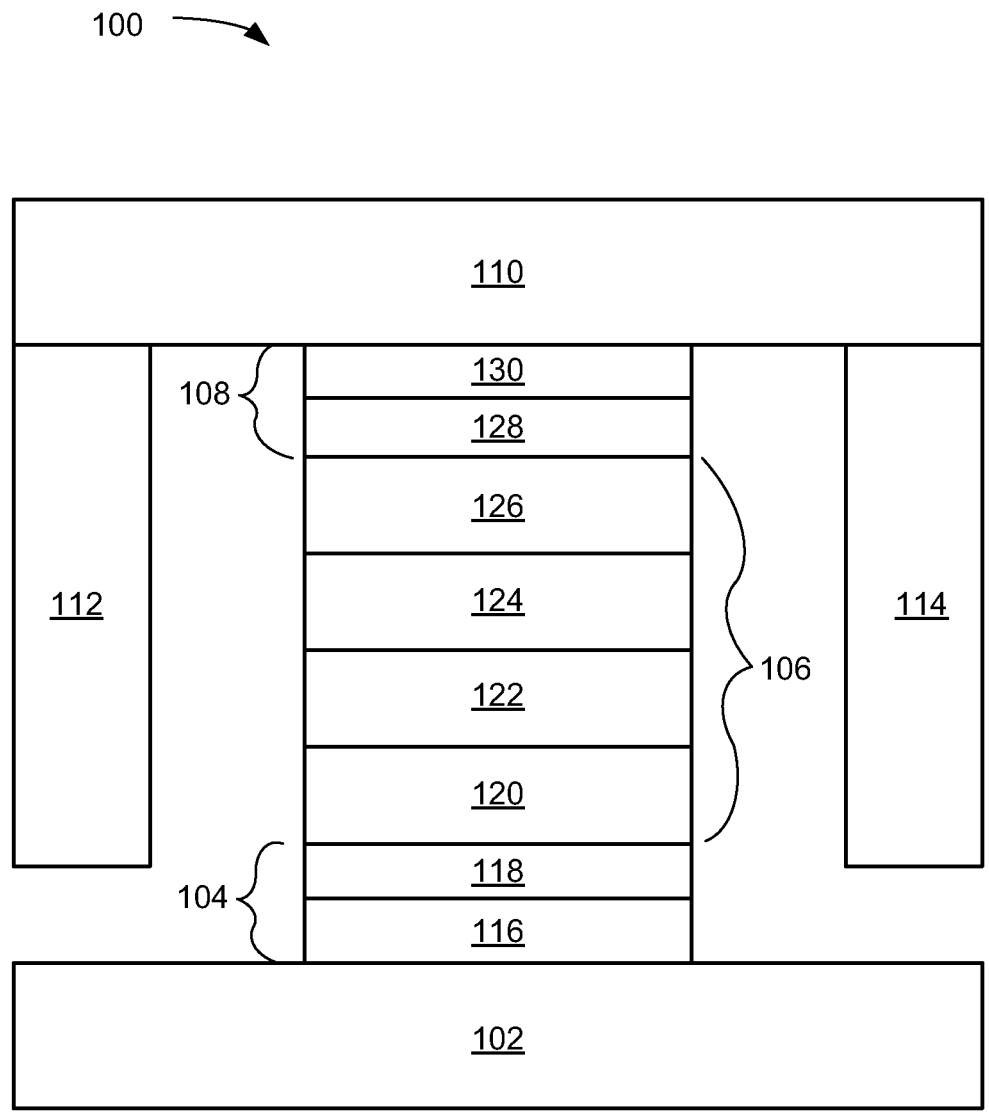
FIG. 1 provides a side view of an exemplary tunneling magneto-resistive sensor, in accordance with certain embodiments of the present disclosure.

FIG. 1 provides a tunneling magneto-resistive (TMR) sensor 100 including a bottom shield 102, seed layer 104, sensor stack 106, cap layer 108, top shield 110, and permanent magnets 112, 114. The seed layer 104 includes a first and second seed buffer layer 116, 118. The sensor stack 106 can include, but is not limited to, an anti-ferromagnetic (AFM) layer 120, synthetic anti-ferromagnetic (SAF) layer 122, barrier layer 124, and free layer 126. The cap layer 108 includes a first and second cap buffer layer 128, 130. Certain spacing and insulating layers of the TMR sensor 100 may be omitted for clarity. Further, layers may not be to scale.

As shown in FIG. 1, the sensor stack 106 is positioned between the bottom shield 102 and the top shield 110, both of which include a crystalline layer comprising nickel-iron (NiFe). In FIG. 1, the first seed buffer layer 116 includes an amorphous layer comprising a chromium-tantalum (CrTa) alloy, for example CrTa$_{40}$. The second seed buffer layer 118 includes a crystalline layer comprising a non-magnetic nickel alloy. The non-magnetic nickel alloy, nickel-tungsten, can include metal additives, for example, NiW$_x$Y (where x=0-20 atm %) and Y stands for metal additives, such as Cr, Zn, Ti, Nb, Fe, Al, Co. These non-magnetic nickel alloys can result in the AFM layer 120 having good <111> orientation. Further, when adjacent to a non-magnetic nickel alloy, the AFM layer 120 can have a full width at half maximum (FWHM) of an x-ray rocking curve equal to 5 degrees or less. Further yet, the crystalline second seed buffer layer 118 provides the seed layer 104 with an orientation of a hexagonal-closed-packed (hcp) or face-centered-cubic (fcc) lattice structure with a <0002> or <111> growth orientation, so that the AFM layer 120 can have a good epitaxy and columnar growth instead of V-shaped growth. As a result the AFM layer 120 could have a small grain size with good orientation and low roughness.

The first seed buffer layer 116 provides a smooth, wetted surface for the second seed buffer layer 118 to grow into a controlled orientation, for example, having a hexagonal-closed-packed (hcp) or face-centered-cubic (fcc) lattice structure with a <0002> or <111> growth orientation, respectively. As a result, the adjacent AFM layer 120 could likewise have a controlled orientation and columnar and small grain size, for example, a hexagonal-closed-packed (hcp) or face-centered-cubic (fcc) lattice structure with a <0002> or <111> growth orientation, respectively.

The first and second cap buffer layers 128, 130 can include the same materials as the first and second seed buffer layers 116, 118, but stacked in reverse order. Certain buffer layers can have a thickness of 1 nanometer or less.

Figure 2:
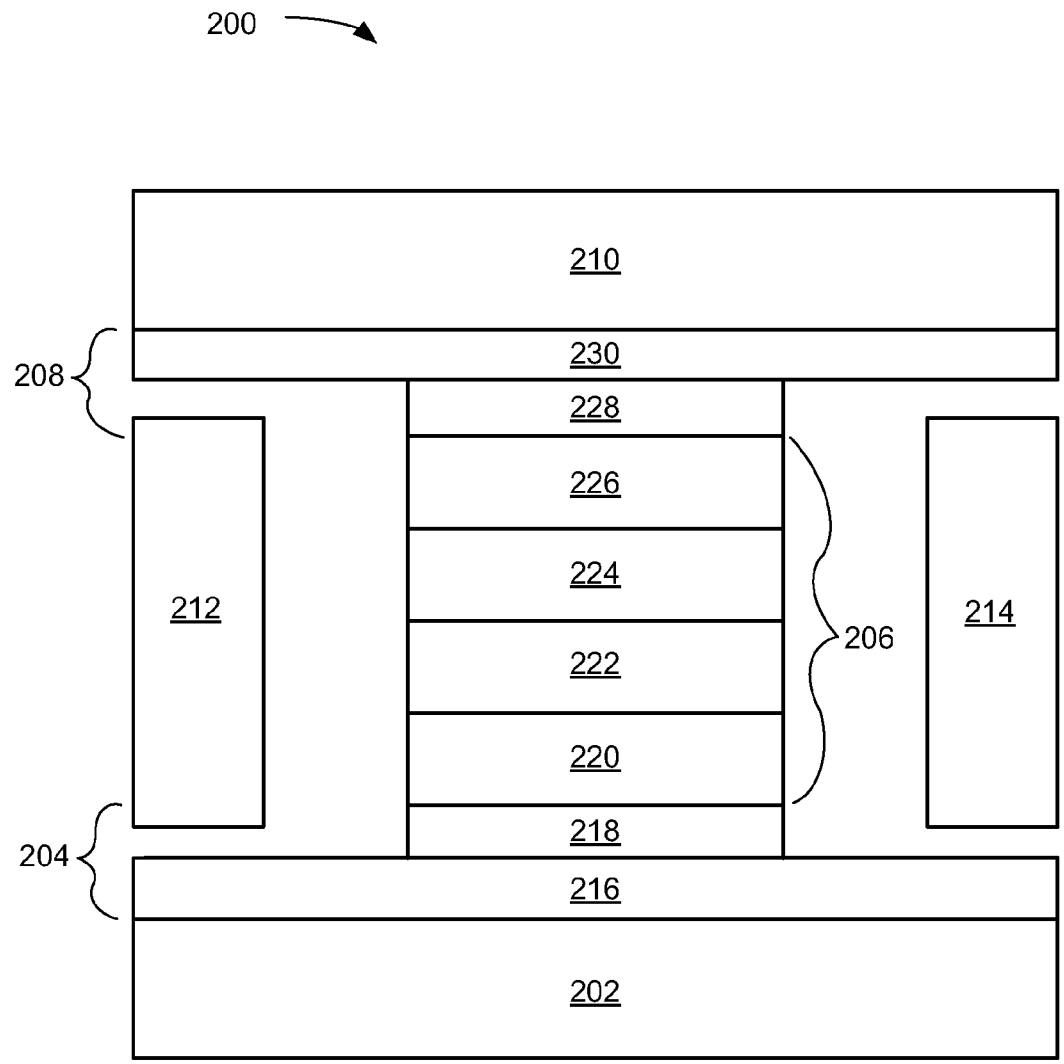
FIG. 2 provides a side view of an exemplary tunneling magneto-resistive sensor, in accordance with certain embodiments of the present disclosure.

FIG. 2 provides a tunneling magneto-resistive TMR) sensor 200 including a bottom shield 202, seed layer 204, sensor stack 206, cap layer 208, top shield 210, and permanent magnets 212, 214. The seed layer 204 includes a first and second seed buffer layer 216, 218. The sensor stack 206 can include, but is not limited to, an anti-ferromagnetic (AFM) layer 220, synthetic anti-ferromagnetic (SAF) layer 222, barrier layer 224, and free layer 226. The cap layer 208 includes a first and second cap buffer layer 228, 230. The side shields 212, 214 are permanent magnets. Certain spacing and insulating layers of the TMR sensor 200 may be omitted for clarity. Further, layers may not be to scale.

In FIG. 2, the first seed buffer layer 216 can include an amorphous magnetic alloy, for example Ni-, Fe-, or Co-alloy, like FeCoZrTa or FeCoB. Further, the amorphous magnetic alloy can include amorphous additives, for example B, Zr, Ta, or Hf. The second seed buffer 218 can include a crystalline layer comprising a non-magnetic nickel alloy, for example nickel-tungsten (NiW$_8$). Alternatively, in certain embodiments, the seed buffer layers can include a magnetic nickel NiFeW and Ruthenium (Ru). The bottom shield 202 and the top shield 210 include a crystalline layer comprising nickel-iron. The first and second cap buffer layers 228, 230 include the same materials as the respective first and second seed buffer layers 216, 218, but stacked in reverse order. Certain buffer layers (e.g., the second seed buffer 218 and the first cap buffer layer 228) can have a thickness of 1 nanometer or less.

Because the first seed buffer layer 216 and the second cap buffer layer 230 are magnetic (e.g., an amorphous magnetic alloy), those layers can be considered to be made part of or act as part of the bottom shield 202 and top shield 210, respectively. Put another way, the first seed buffer layer 216 and/or the second cap buffer layer 230 can effectively act or perform as a magnetic buffer and a magnetic shield. As a result, spacing is reduced. Moreover, this arrangement of materials would permit the thickness of the first seed buffer layer 216 and the second cap buffer layer 230 to be made thicker, resulting in reduced design constraints and controlled orientation of the second seed buffer layer 218 and the first cap buffer layer 228.

Figure 3:
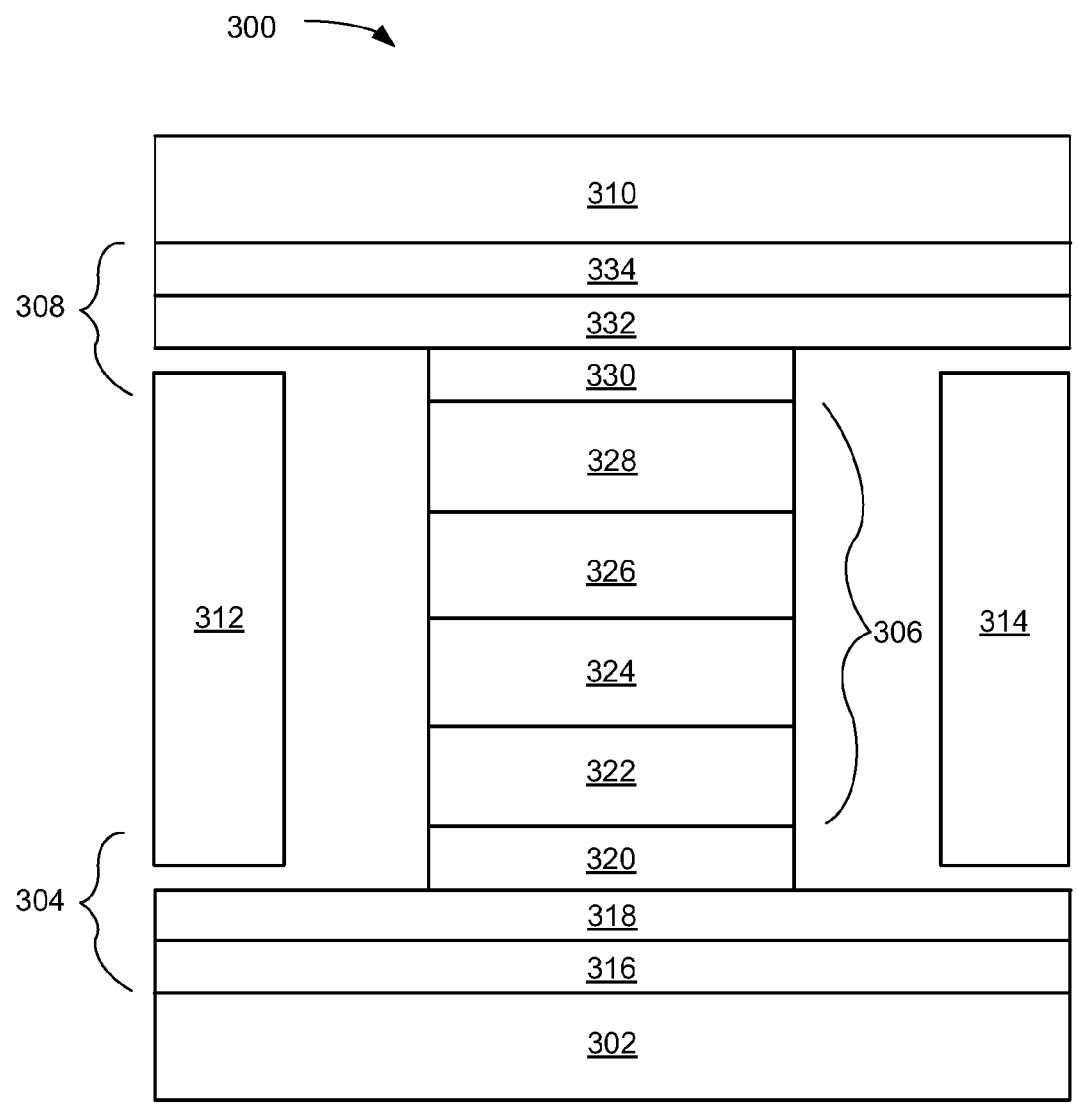
FIG. 3 provides a side view of an exemplary tunneling magneto-resistive sensor, in accordance with certain embodiments of the present disclosure.

FIG. 3 provides a tunneling magneto-resistive (TMR) sensor 300 including a bottom shield 302, seed layer 304, sensor stack 306, cap layer 308, top shield 310, and permanent magnets 312, 314. The seed layer 304 includes a first, second, and third seed buffer layer 316, 318, 320. The sensor stack 106 can include, but is not limited to, an anti-ferromagnetic (AFM) layer 322, synthetic anti-ferromagnetic (SAF) layer 324, barrier layer 326, and free layer 328. The cap layer 308 includes a first, second, and third cap buffer layer 330, 332, 334. The side shields 312, 314 are permanent magnets. Certain spacing and insulating layers of the TMR sensor 300 may be omitted for clarity. Further, layers may not be to scale.

In FIG. 3, the first seed buffer layer 316 includes an amorphous magnetic alloy, for example a Ni-, Fe-, or Co-alloy, like FeCoZrTa. The second seed buffer layer 318 includes a crystalline layer comprising a nickel alloy having a magnetic moment, for example $NiFe_{20}$. Further, the crystalline layer could also include Ni-alloys with other magnetic elements, for example, $NiFe_xY$ (where x=0-50 atm %) and where Y stands for metal additives such as Cr, Zn, Ti, Nb, Fe, Al, or Co.

The third seed buffer 320 includes a crystalline layer comprising a non-magnetic nickel alloy, for example $NiW_8$. The bottom shield 302 and the top shield 310 can include a crystalline layer comprising nickel-iron. The first, second, and third cap buffer layers 330, 332, 334 include the same materials as the first, second, and third seed buffer layers 316, 318, 320, but stacked in reverse order. Certain buffer layers (e.g., the third seed buffer 320 and the first cap buffer layer 330) can have a thickness of 1 nanometer or less.

Because the first and second seed buffer layers 316, 318 and the second and third cap buffer layers 332, 334 are magnetic, those layers can be considered or act as part of the bottom shield 302 and top shield 310, respectively. As a result, shield-to-shield spacing is reduced. Moreover, this arrangement of materials would permit the thickness of the first and second seed buffer layers 316, 318 and the second and third cap buffer layers 332, 334 to be made thicker, resulting in reduced design constraints and controlled orientation of the third seed buffer layer 320 and the first cap buffer layer 334. For example, the thickness of the second seed buffer layer 318 could be 5 nanometers or thicker.

The bottom and top shields 302, 310 can alternatively include an amorphous magnetic alloy, for example a Ni-, Fe-, or Co-alloy, like FeCoZrTa and FeCoB. Further, the amorphous magnetic alloy can include amorphous additives, for example B, Zr, Ta, or Hf Amorphous magnetic alloys are smooth (or have a low surface roughness) and by using amorphous magnetic alloys for the bottom and top shields 302, 310, certain manufacturing steps can be eliminated, for example certain steps of electroplating and chemical mechanical polishing (CMP) could be skipped, thereby increasing overall manufacturing yield and efficiency for the TMR sensor 300.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed,

What is claimed is:

1. A tunneling magneto-resistive (TMR) sensor comprising:
a sensor stack positioned between a seed layer and a cap layer, wherein the seed layer includes a first buffer layer comprising a nickel alloy and a second buffer layer comprising a chromium tantalum alloy.

2. The TMR sensor of claim 1, wherein the nickel alloy is a non-magnetic nickel alloy.

3. The TMR sensor of claim 2, wherein the non-magnetic nickel alloy is a nickel-tungsten alloy.

4. The TMR sensor of claim 1, wherein both the first buffer layer and the second buffer layer are less than 1 nanometer thick.

5. A sensor comprising:
a top and bottom shield; and
a seed layer positioned adjacent to the bottom shield and having a first buffer layer comprising a nickel alloy, and a second buffer layer comprising a chromium-tantalum alloy.

6. The sensor of claim 5, wherein a cap layer is provided adjacent the top shield and the cap layer includes a third buffer layer comprising a chromium-tantalum alloy.

7. A sensor comprising:
a top and bottom shield;
a seed layer positioned adjacent the bottom shield and having a first buffer layer comprising a nickel alloy, and a second buffer layer comprising a chromium-tantalum alloy; and
a cap layer adjacent to the top shield having a third buffer layer comprising a nickel alloy.

\* \* \* \* \*